US009105996B2

(12) United States Patent
Falchi et al.

(10) Patent No.: US 9,105,996 B2
(45) Date of Patent: Aug. 11, 2015

(54) ELECTRONIC CIRCUIT COMPRISING ELECTRICAL CONNECTIONS RESISTANT TO A SEVERE ENVIRONMENT (75) Inventors: Danilo Falchi, Cergy (FR); Dominique Dupuis, Billericay (GB); Guillaume Bonvallat, Meru (FR); Fabrice Herault, Flins sur Seine (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 23 days.

(21) Appl. No.: 13/995,323

(22) PCT Filed: Oct. 13, 2011

(86) PCT No.: PCT/FR2011/052387
§ 371 (c)(1),
(2), (4) Date: Oct. 9, 2013

(87) PCT Pub. No.: WO2012/085367
PCT Pub. Date: Jun. 28, 2012

(65) Prior Publication Data
US 2014/0028417 A1    Jan. 30, 2014

(30) Foreign Application Priority Data
Dec. 22, 2010   (FR) .................................... 10 61094

(51) Int. Cl.
*H01R 13/22*   (2006.01)
*F01L 9/04*    (2006.01)
(Continued)

(52) U.S. Cl.
CPC . *H01R 13/22* (2013.01); *F01L 9/04* (2013.01); *H01R 12/55* (2013.01); *F01L 2009/0401* (2013.01); *F01L 2009/0405* (2013.01);
(Continued)

(58) Field of Classification Search
CPC ...................... H01L 2924/014; H01L 2224/48; H01L 2224/81801; H01L 24/13; H01L 24/45; H01L 24/49; B23K 1/0016; Y10S 439/95; E21B 33/0385; F01L 2009/0463; H01H 1/58; A61B 2018/00178
USPC ........................................................ 335/278
See application file for complete search history.

(56) References Cited

U.S. PATENT DOCUMENTS 4,023,008 A * 5/1977 Durussel ....................... 219/522
4,513,064 A   4/1985 Marcus
(Continued)

FOREIGN PATENT DOCUMENTS

| EP | 1 819 150 A1 | 8/2007 |
| EP | 1 970 996 A2 | 9/2008 |
| WO | 2010/136701 A1 | 12/2010 |

OTHER PUBLICATIONS

International Search Report issued in PCT/FR2011/052387 mailed on Jun. 21, 2012 (6 pages).

*Primary Examiner* — Shawki S Ismail
*Assistant Examiner* — Lisa Homza
(74) *Attorney, Agent, or Firm* — Osha Liang LLP (57) ABSTRACT The invention relates to an electromagnetic actuator comprising a housing (9) having several faces (20, 21) and an electronic control circuit (14) split into at least two parts (14a, 14b) distributed over at least two adjacent faces (20, 21) of the housing (9), each part (14a) of the circuit comprising at least one metallic connector (25a) arranged so as to be connected electrically and mechanically with a metallic connector (25b) of another part of the circuit (14b) so as to form an electrical connection (24).

7 Claims, 4 Drawing Sheets (51) Int. Cl.
*H01R 12/55* (2011.01)
*H01R 12/57* (2011.01)
*H01R 12/71* (2011.01)
*H05K 1/14* (2006.01)

(52) U.S. Cl.
CPC .. *F01L2009/0457* (2013.01); *F01L 2009/0463* (2013.01); *H01R 12/57* (2013.01); *H01R 12/718* (2013.01); *H05K 1/14* (2013.01); *H05K 2201/1031* (2013.01)

(56) References Cited

U.S. PATENT DOCUMENTS

| | | | | |
|---|---|---|---|---|
| 4,775,917 | A | * | 10/1988 | Eichhorn et al. ............... 361/708 |
| 7,006,356 | B2 | * | 2/2006 | Bergmann et al. ............. 361/736 |
| 8,198,712 | B2 | * | 6/2012 | Zhuang et al. ................. 257/678 |
| 2008/0029875 | A1 | * | 2/2008 | Zhuang et al. ................. 257/691 |
| 2010/0159755 | A1 | | 6/2010 | Lin et al. |

* cited by examiner

ELECTRONIC CIRCUIT COMPRISING ELECTRICAL CONNECTIONS RESISTANT TO A SEVERE ENVIRONMENT

The invention relates to the implementation of electrical connections between two electrical circuits or two portions of electrical circuit. In particular it applies to electromagnetic actuators.

BACKGROUND OF THE INVENTION

The most widespread motorization systems usually comprise an internal combustion heat engine comprising an engine block delimiting combustion chambers having one end closed by a cylinder head and an opposite end closed by a piston slidingly received in the engine block. The pistons are linked by a connecting rod to a crankshaft arranged to transform the reciprocating sliding movement of the pistons into a continuous rotary movement communicated to the drive wheels of the vehicle via the clutch and the gearbox. The cylinder head comprises ducts for connecting combustion chambers to an air-supply circuit and to an exhaust circuit for the burnt gases. In four-stroke heat engines, these connection means comprise valves that can move between a position of closing off the ducts and a position of opening the ducts.

In the motor vehicle field, the desire to reduce consumption and carbon dioxide emissions is leading manufacturers to incorporate electronic components within the engine in order to closely control each parameter thereof. The engine compartment of a vehicle is a severe environment in which a high temperature, vibrations and an atmosphere saturated with oil mist prevail. The electronic components and the electronic circuits in particular must be protected from the temperature and the oil in particular.

In order to optimize the efficiency of the engine, the purely mechanical members, such as the camshaft for actuating the valves, are frequently replaced by electromagnetic actuators controlled by an electronic circuit. These electronic circuits are installed as close as possible to the actuators in order to limit the cables between the control members and the actuators.

The actuators are driven by a control electronic circuit incorporating computing electronics and power electronics, sensors, interfaces, etc. Therefore, the circuits, which are produced on a flat rigid support, can be voluminous and occupy considerable space because of the integrated functions.

In order to limit the volume occupied by the electronic circuits, the support of the circuit could be attached to a face of the actuator housing. However, the dimension of the circuit would then be limited to the size of the actuator housing.

In order to restrict the volume occupied by the actuator, it is envisaged to divide the control circuit into several portions distributed over several faces of the actuator housing. The portions would then be linked together electrically.

Conventional connection means use an electrical connection comprising a male portion inserted into a female receiver, like a connection via pins. In connections with multiple pins, a portion of the circuit comprises a series of female sockets organized in a comb and the other portion of the circuit comprises a male grid receiving the female sockets. However, in the severe environment of the engine, this type of connection does not provide sufficient resistance to ensure the operation of the circuit over time, because the contact between the male and female portions of the connection involves pinching. Moreover, such a connection requires great precision in production because the sockets are usually small and do not withstand the deformations.

The invention therefore proposes a novel type of connection suitable for the environment of the engine.

SUBJECT OF THE INVENTION

The invention relates to a first electrical connector of an electronic circuit, said connector being in the form of a blade and comprising:
 a first portion forming a foot having a first sub-portion extending substantially on a plane and designed to be assembled by brazing onto said electronic circuit,
 a second portion extending in a direction substantially transverse to said brazing sub-portion of the first portion and comprising a contact surface designed to be placed in contact with an electrical connector.

According to one embodiment of the connector, the first portion comprises a flexible element between the brazing sub-portion and said second portion.

According to one embodiment of the connector, the flexible element comprises at least one fold.

According to one embodiment of the connector, the flexible element is substantially S-shaped.

According to one embodiment of the connector, the brazing sub-portion comprises at least two lugs extending on substantially the same line and separated by a median lug extending on the same line but in a direction opposite to the two lugs.

According to one embodiment, the connector comprises a thermally conducting material.

The invention also relates to a second electrical connector of an electronic circuit, said connector being in the form of a blade and having a portion comprising a surface designed to come into contact with the contact surface of the second portion of the first electrical connector.

The invention also relates to an electrical connection assembly of an electronic circuit comprising the first connector according to the invention and the second connector according to the invention.

The invention also relates to an electronic circuit comprising a support and at least the first connector according to the invention, said first sub-portion of the first portion of the connector being brazed onto the support.

The invention relates to an electronic circuit comprising at least two distinct portions, the portions of the circuit being electrically linked by connections comprising at least two connectors each linked to a portion of the circuit, each connector comprising a substantially flat contact surface and means for rigidly linking the contact surfaces together.

Therefore, the connections allowing the electrical link between the portions of the circuit are rigid and can withstand the high temperatures and the vibrations. The connection comprises no male or female portion which makes it possible to produce a strong mechanical link, for example by welding.

Advantageously, the connectors may comprise a flexible foot making it possible to adjust the respective positions of the connectors before assembly and providing flexibility in the connection so as to better withstand the vibrations and the expansion of the components.

According to one embodiment of the electronic circuit, the connector comprises a blade comprising at least one electrical contact surface and a foot extending the blade and linking the blade to a portion of the circuit.

According to one embodiment of the electronic circuit, the connectors are arranged so that the blade of a connector of a first portion is placed parallel to at least one blade of a second portion so that the contact surfaces of each blade are in contact.

According to one embodiment of the electronic circuit, the connectors are connected by welding.

According to one embodiment of the electronic circuit, the connectors are connected by mechanical means.

According to one embodiment of the electronic circuit, the connectors comprise a flexible foot.

The invention also relates to an electromagnetic actuator comprising an electronic circuit according to the invention.

The invention also relates to an electromagnetic actuator comprising a housing having several faces and an electronic control circuit divided into at least two portions which are distributed over at least two adjacent faces of the housing. According to the invention, each portion of the circuit comprises at least one metal connector arranged to be electrically and mechanically connected to a metal connector of another portion of the circuit in order to form an electrical connection.

The electronic circuit may incorporate, amongst other things, computing electronics, power electronics, sensors or interfaces. The electronic circuit controls for example the operation and/or the power of the signal delivered to the actuator. In particular, the circuit is also called an electronic power circuit when it is incorporated into power electronics.

According to one embodiment of the actuator, the connections are placed so as to form teeth of at least two combs, the teeth of the combs being offset.

According to one embodiment of the actuator, each connector comprises a substantially flat electrical contact surface and means for rigidly linking the contact surfaces together.

According to one embodiment of the actuator, the connectors comprise a blade comprising at least the electrical contact surface and a foot extending the blade and linking the blade to a portion of the circuit.

According to one embodiment of the actuator, the connectors are arranged so that the blade of a connector of a first portion is placed parallel to at least one blade of a second portion so that the contact surfaces of each blade are in contact.

According to one embodiment of the actuator, a first circuit portion is made on a first support portion attached to an upper face of the housing, a second circuit portion is made on a second support portion attached to a front face of the housing, and the connectors of the first circuit portion comprise a blade oriented perpendicularly to the upper face of the housing while the blades of the connectors of the second circuit portion are oriented parallel to the front face of the housing.

According to one embodiment of the actuator, the connectors are connected by welding.

According to one embodiment of the actuator, the connectors are connected by mechanical means.

According to one embodiment of the actuator, the connectors comprise a flexible foot.

BRIEF DESCRIPTION OF THE DRAWINGS

Reference will be made to the appended drawings, amongst which.

DETAILED DESCRIPTION OF THE INVENTION

The basic idea of the invention is to distribute the electronic circuit over the faces of the actuator housing in order to obtain a housing that is compact and incorporates a complete electronic circuit.

Figure 1:
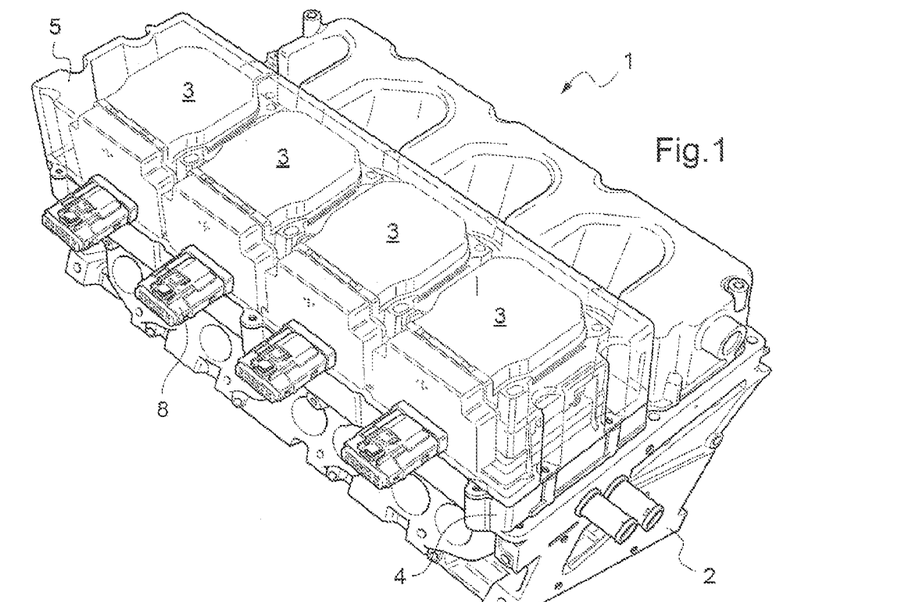
FIG. 1 is a view of a motorization system according to the invention.

FIG. 1 illustrates a motorization system comprising a four-stroke internal combustion heat engine 1. The engine 1 is formed of an engine block (not shown) and of a cylinder head 2 mounted on the engine block and covered with a cylinder head cover 5 delimiting with the cylinder head 2 a housing for a group of valve actuators 3. The actuators 3 are attached to the cylinder head 2 and rest on the latter each by a shoe 4. The cylinder head cover 5 is in this instance depicted as transparent in order to allow a glimpse of the actuators 3. The general structure and the operation of such a heat engine are known in themselves and will not be explained in greater detail here.

The valve actuators 3 allow the actuation of the inlet and outlet valves instead of a camshaft. It is therefore possible to control each valve individually and to carry out complex and optimized combustion cycles. The actuators are produced as standalone members. They comprise members for the movement of the valves, usually an actuation sliding stem having one end interacting with the valve and one end secured to a vane accommodated in electromagnetic coils capable of exerting an attraction force on the vane in opposite directions. The coils are linked to an integrated electronic circuit controlling and powering the members for the movement of the valves.

Figure 2:
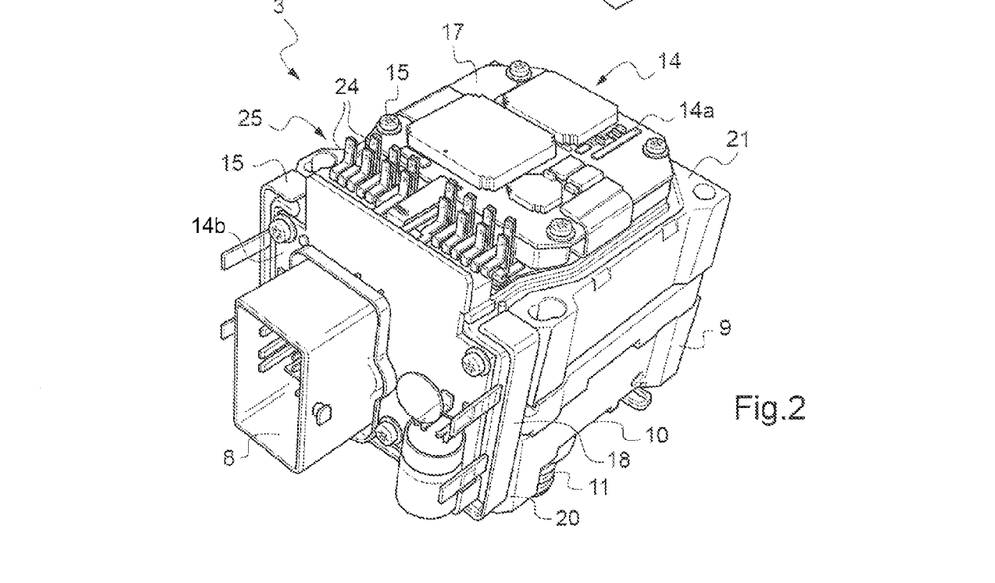
FIG. 2 illustrates an actuator, seen in FIG. 1, without its capping according to the invention.

FIG. 2 illustrates more particularly one of the actuators seen in FIG. 1.

In this exemplary embodiment, the actuator comprises a metal housing 9 enclosing the members for the movement of the valves. Also shown, on a lower face 10 of the housing 9, is a valve-actuation stem 11 and its return spring which protrude from the housing 9 and which are designed to be inserted into the cylinder head 2. The actuator 3 also comprises a connector plug 8 placed on the front face and used to link the electronic circuit 14 to a power source and to an engine control unit or ECU.

More precisely, the electronic circuit bearing the reference 14 comprises a support 15 divided into a first support portion 17 and a second support portion 18, and electronic components distributed over each support portion 17, 18. The support portions 17, 18 are each attached respectively to a face of the housing 9, in this instance to the upper face 21 and to the front face 20. The electronic circuit 14 therefore comprises two portions 14a and 14b which are electrically linked together via electrical connections 24.

The first circuit portion 14a is produced on a first support portion 17 which is attached to the upper face of the housing. A second circuit portion 14b is produced on a second support portion 18 attached to the front face 20.

Figure 3:
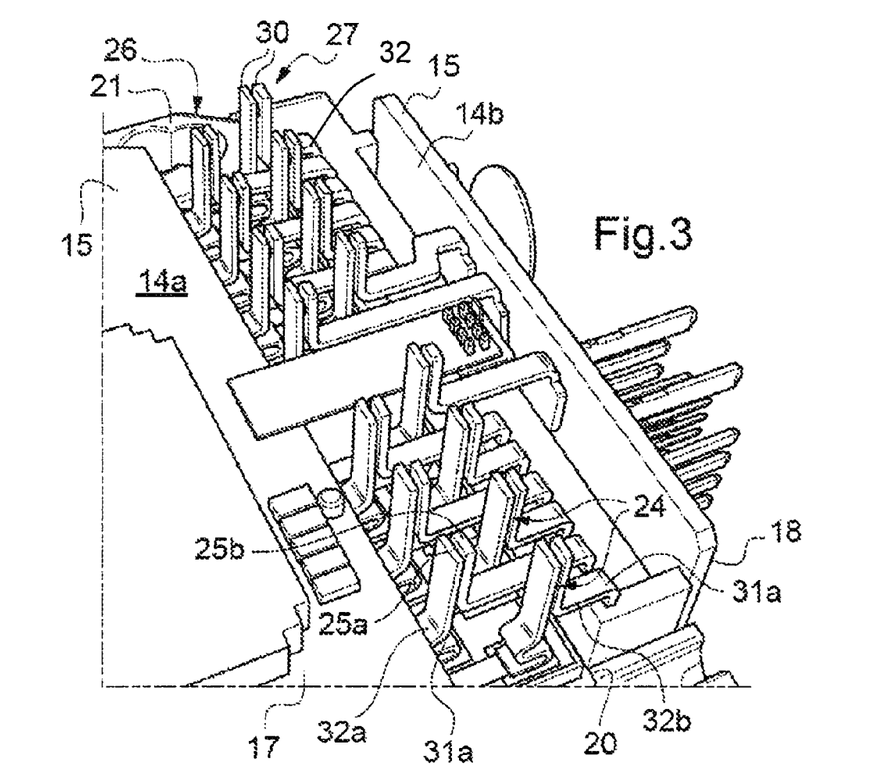
FIG. 3 is a detailed view of a first embodiment of the connectors of the electronic circuit of an actuator illustrated in FIG. 2.

The circuit portions 14a and 14b are electrically linked by connections 24 arranged in two parallel combs 26 and 27 as illustrated in FIG. 3.

The connections 24 are formed by the rigid mechanical assembly of a connector 25a and of a connector 25b which are electrically linked respectively to the circuit portions 14a and 14b.

Each connector 25 comprises a rigid blade 30 comprising a contact surface designed to be placed in contact with the contact surface of the blade 30 of another connector 25. The blades 30 are supported by a foot 32 which electrically and mechanically links the blade 30 to the electronic circuit portion to which the connector belongs.

Since the housing 9 of the actuator is a parallelepiped, the connectors 25a of the circuit portion 14a comprise a blade 30a oriented perpendicularly to the upper face 21 of the housing while the blades 30b of the connectors 25b of the circuit portion 14b are oriented parallel to the front face 20 of the housing 9.

The connectors are mounted on the support portions 17, so that each connector 25a is placed facing a connector 25b when the circuit portions 14a, 14b are attached to the housing 9. Thus, each blade 30 of each connector 25 is placed parallel to the blade 30 of the corresponding connector 25b, the contact surfaces facing one another.

The blades 30 of the connectors 25a and 25b are then assembled by welding to form the connection 24.

The arrangement of the connections 24 in several parallel combs, of which the teeth are offset, makes it possible to space the connections 24 more, which makes the assembly of the connectors 25 easier. It is possible to align the connections 24 on a single comb, but the proximity of the connections 24 would lead to a more awkward welding operation.

The connections 24 thus produced perfectly withstand the temperature and the vibrations because they also produce mechanical links.

Advantageously, the connections 24 may comprise a flexible element in order to make it easier to place the blades 30 in contact with one another and to improve the resistance of the connection 24 to the expansion and the vibrations.

Thus, as illustrated in FIG. 3, the respective feet 32a and 32b of the connectors 24a and 24b comprise respectively springs 31a and 31b.

The connector 24a comprises a foot 32a comprising a spring 31a formed of an S-shaped fold of the lower end of the blade 30. The S-shaped spring is used to link the blade 30 to the circuit portion 14a over a short length while adding flexibility to the blade 30, because the S shape of the spring is both compact and flexible.

Similarly, the connector 24b comprises a foot 32b comprising a spring 31b formed by a spring strip 35 perpendicular to the blade 30 and extending the latter. The strip also makes it possible to achieve the electrical link between the blade 30 and the circuit portion 14b.

Naturally, the invention is not limited to the embodiment described above.

Therefore, the choice of the type of spring depends essentially on the orientation of the connectors and on the distance separating the blades 30 from the circuit portions. The orientation of the connectors 25b advantageously makes it possible to use spring strips 31b which are easy to produce and make it possible to link the connectors 25b to the circuit portion 14b.

Similarly, the S-shaped springs 31a are adapted to the connector 25a because they are compact and make it possible to orient the latter perpendicularly to the circuit portion 14a.

The connectors 25 are preferably assembled by welding. However, any method making it possible to rigidly assemble the blades 30 can be envisaged, provided that the electrical link is established. Thus, it is possible to assemble the blades by screw and nut, or by another mechanical element of the clamp type.

It is important to note that the terms "first circuit portion and second circuit portion" have been chosen with no connection to a priority of one circuit portion over the other. Specifically, the position of the connectors, their respective orientations relative to the faces of the housing, their number and their respective arrangement are given only as an example.

It is also possible to divide the electronic circuit into more than two portions.

Figures 4, 4A:
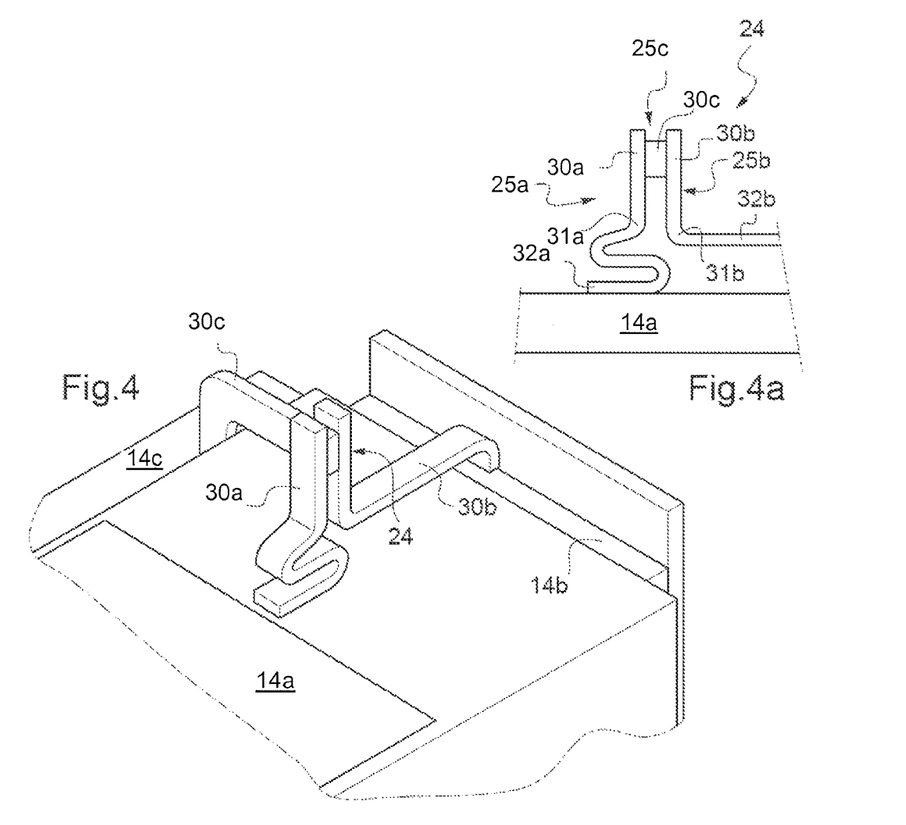
FIG. 4 is a detailed view of a second embodiment of the connectors of the electronic circuit of an actuator illustrated in FIG. 2.
FIG. 4a is a detailed view of a connection seen in FIG. 4.

If the circuit comprises three distinct portions attached to adjacent faces, it is possible to use the same connectors to electrically link the portions together. Thus, the blades 30 of the connectors may be oriented perpendicularly to one another, provided that the contact surfaces of the blades 30 are parallel in order to be able to carry out the assembly. FIG. 4 illustrates an example of connection between three circuit portions 14a, 14b and 14c by virtue of the connectors 25a, 25b and 25c. The circuit portions are attached to perpendicular and adjacent faces of the housing 9 and the connection 25 is made in line with the face of the housing 9 comprising the circuit portion 14c.

FIG. 4a is a close-up of the profile connection 25 which shows the contacts between the three connectors.

The blades 30b and 30a are directed in parallel while the blade 30c is perpendicular to the other two while being held between the blades 30a and 30b.

The blades are assembled as described above and preferably by welding.

Therefore, it is possible to divide the electric circuit into as many portions as the housing has faces. The electrical links between the circuit portions can preferably be made as indicated above, but other types of connections are possible such as pins or flexible electrical wires welded between two points.

In order to simplify the manufacture and the installation of the electronic circuit, it is also possible to produce the support 15 of the circuit in a single piece. According to the exemplary embodiment illustrated in FIG. 2, the support comprises a first portion 17 and a second portion 18, which are independent, attached independently from one another to the housing 9. But it is possible to produce a rigid support in a single piece, in the shape of an "L" or of an angle section, which would then be attached to the housing 9. The electrical links between the circuit portions could therefore be made directly on the support according to a known method.

Thus, the circuit is divided into two portions distributed over two faces of the housing, but only one support 15 is necessary.

Advantageously, each support portion 17, 18 incorporates connection means 25a, 25b connected together and to the circuit portions 14a, 14b in order to provide an electrical link of the circuit portions 14a, 14b with one another. Thus, the connectors 25a, 25b are supported by their respective supports.

The connectors 25a, 25b will be described more precisely by making reference to FIGS. 4 to 8.

Figure 5:
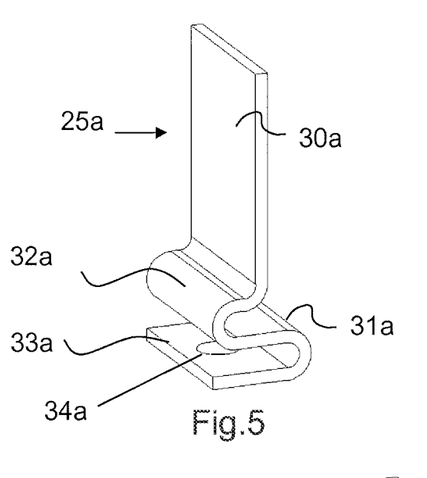
FIG. 5 shows an example of an electrical connector according to the invention.
Figure 6:
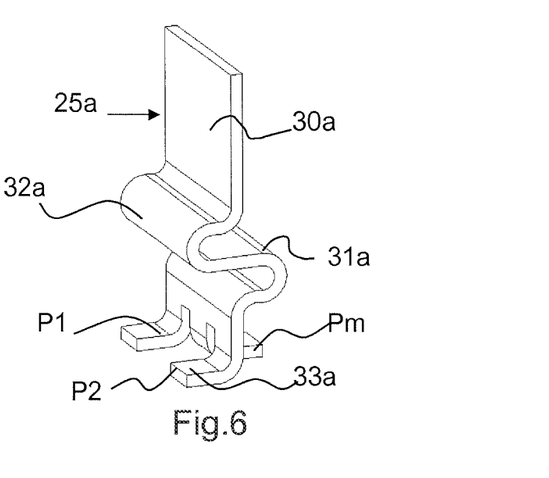
FIG. 6 shows another example of an electrical connector according to the invention.
Figure 7:
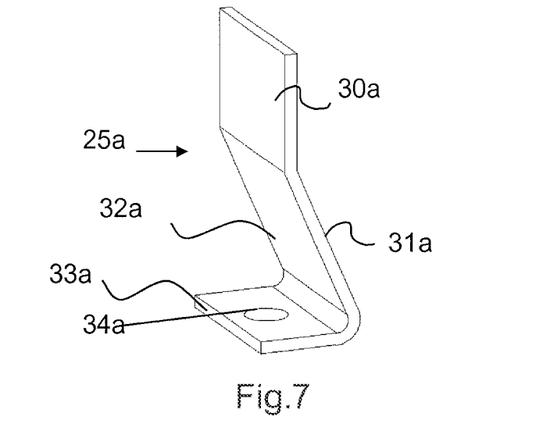
FIG. 7 is yet another example of an electrical connector according to the invention.

A first connector 25a has a blade shape and forms an electrical connection part of an electronic circuit 14a.

The first connector 25a comprises a first portion forming a foot 32a having a first sub-portion 33a extending substantially along a plane. This first sub-portion 33a is designed to be assembled by brazing onto the electronic circuit.

The first connector 25a also comprises a second portion 30a extending in a substantially transverse, or even perpendicular direction to the brazing sub-portion 33a of the first portion 32a. The second portion 30a comprises a contact surface designed to be placed in contact with an electrical connector.

In the connector 25a, the foot 32a separates the contact surface from the brazing sub-portion 33a in a direction that is transverse to the brazing sub-portion. Thus, when the connector 25a is mounted on the electronic circuit, a subsequent electrical connection of the electronic circuit may be obtained without requiring access to the surface of the circuit. Specifically, the first connector 25a shifts the contact surface above the electronic circuit. This avoids the environmental stresses of the electronic circuit which may prevent the access of the welding tools to the surface of the electronic circuit.

The brazing sub-portion 33a provides a mechanical and electrical contact between the first connector 25a and the electronic circuit. It is configured to provide a seat for the first connector 25a on the electronic circuit. For example, the brazing sub-portion 33a is in the form of a flat parallelepiped, as illustrated in FIG. 5. In another example illustrated in FIG. 6, the brazing sub-portion 33a comprises at least two lugs P1, P2 extending on substantially the same line and separated by a median lug Pm extending on the same line but in a direction opposite to the two lugs P1, P2.

The brazing sub-portion may comprise a hole 34a making it possible to position the first connector 25a on the surface of the electronic circuit 14a. For example, the hole 34a is designed to receive a pin from the surface of the electronic circuit 14a.

By virtue of the brazing sub-portion 33a, the first connector 25a can be surface-mounted on the electronic circuit 14a, for example at the same time as other SMC components (Surface-Mounted Components). Once mounted on the circuit, the first connector 25a extends from a single face of the circuit.

The first portion of the first connector 25a may comprise a flexible element 31a between the brazing sub-portion 33a and the second portion 30a. The flexible element 31a makes it possible to absorb the mechanical clearances during the assembly of the first connector 25a on the circuit 14a or when placing the contact surface in contact with for example a second connector 25b. The flexible element 31a also makes it possible to compensate for the differential expansion of the connectors and of the electronic circuit during the temperature variations.

For example, the flexible element 31a comprises at least one fold. FIGS. 5 to 7 show examples of a first connector 25a. In FIGS. 5 and 6, the flexible element is substantially S-shaped. In FIG. 7, the flexibility is obtained by a single fold.

For example, the first electrical connector 25a comprises a thermally conductive material. Thus, the first connector 25a makes it possible to dissipate the heat generated by the electrical connection, for example by a second connector 25b. In particular, the first connector 25a allows heat transfer by means of the electronic circuit to a heat sink on which the circuit could be placed.

When the first connector 25a is mounted on the electronic circuit 14a, a second electrical connector 25b can then be placed in electrical contact, in particular rigidly linked with the contact surface of the first connector 25a. This produces the electrical connection of the electronic circuit 14a with, for example, another electronic circuit or a power source such as a battery.

The electrical connection of the electronic circuit 14a can then be produced at a distance from the surface of the electronic circuit. The electrical link point between the second connector 25b and the electronic circuit is shifted to a distance in a direction perpendicular to the electronic circuit 14a. The electrical connection of the electronic circuit 14a therefore avoids the difficulties of access to the surface of the circuit.

The second electrical connector 25b of the electronic circuit may be in the form of a blade and have a portion 30b comprising a surface designed to come into contact with the contact surface of the first connector 25a. In particular, the contact between the first connector 25a and the second connector 25b can be achieved by welding.

Figure 8:
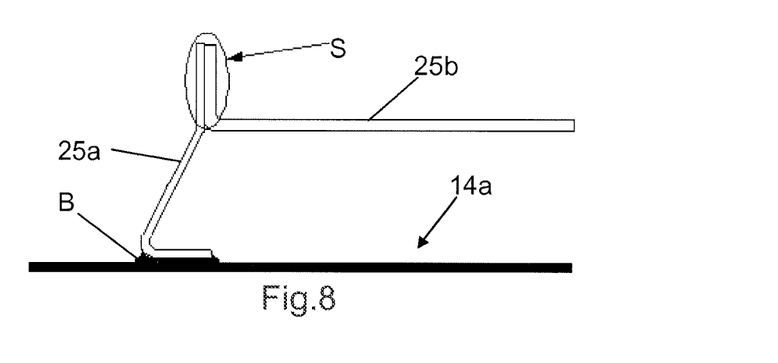
FIG. 8 shows an example of an electronic circuit board according to the invention.

In the context of the present application, the electronic circuit is for example an electronic circuit board having a support and electronic components mounted on a surface of the support, also called a PCB (for Printed Circuit Board). For example, the first connector 25a is mounted on the electronic circuit board with other electronic components. The attachment of the first connector 25a and of the components may be achieved by brazing during a pass in an oven.

FIG. 8 shows an example of an electronic circuit board 14a which comprises at least the first connector 25a. The brazing surface 33a of the first connector 25a can be assembled to the support of the circuit board 14a by a braze B.

The second connector 25b can subsequently come into electrical contact with the first connector 25a. Preferably, the contact surfaces of the connectors 25a, 25b extend on a plane and are placed facing one another. The connection between the contact surfaces of the connectors 25a, 25b is therefore achieved on a plane. For example, the connection between the contact surfaces is achieved by a weld S. However, any method making it possible to rigidly assemble the contact surfaces can be envisaged, provided that the electrical link is established. Thus, it is possible to assemble the blades by screw and nut, or by another mechanical element of the clamp type.

The invention claimed is:

1. An electromagnetic actuator comprising:
a housing having several faces; and
an electronic circuit divided into at least two portions distributed over at least two adjacent faces of the housing, each portion of the circuit comprising at least one first metal connector arranged to be electrically and mechanically connected to a second metal connector of another portion of the circuit in order to form an electrical connection,
the first metal connector comprising:
a first portion forming a foot having a first sub-portion extending substantially on a plane and designed to be assembled by brazing onto said electronic circuit,
a second portion extending in a direction substantially transverse to said brazing sub-portion of the first portion and comprising a contact surface designed to be placed in contact with an electrical connector, and
the second metal connector comprising a portion having a surface designed to come into contact with the contact surface of the second portion of the first metal connector.

2. The electromagnetic actuator as claimed in claim 1, wherein the first metal connector or the second metal connector is in the form of a blade.

3. The electromagnetic actuator as claimed in claim 1, wherein the first portion comprises a flexible element between the brazing sub-portion and the second portion.

4. The electromagnetic actuator as claimed in claim 3, wherein the flexible element comprises at least one fold.

5. The electromagnetic actuator as claimed in claim 3, wherein the flexible element is substantially S-shaped.

6. The electromagnetic actuator as claimed in claim 1, wherein the connector comprises a thermally conducting material.

7. The electromagnetic actuator as claimed in claim 1, wherein
- the electronic circuit comprises a support, and
- the first sub-portion is brazed onto the support.

\* \* \* \* \*